(12) United States Patent
Wiener

(10) Patent No.: US 6,993,411 B2
(45) Date of Patent: Jan. 31, 2006

(54) SYSTEM AND METHOD FOR DISCRETE TIME TRAJECTORY PLANNING FOR LITHOGRAPHY

(75) Inventor: Roberto B. Wiener, Bethel, CT (US)

(73) Assignee: ASML Holding N.V., Veldhoven (NL)

(*) Notice: Subject to any disclaimer, the term of this patent is extended or adjusted under 35 U.S.C. 154(b) by 9 days.

(21) Appl. No.: 10/871,576

(22) Filed: Jun. 21, 2004

(65) Prior Publication Data

US 2004/0230326 A1 Nov. 18, 2004

Related U.S. Application Data

(63) Continuation of application No. 09/923,397, filed on Aug. 8, 2001, now Pat. No. 6,760,641.

(51) Int. Cl.
*G06F 19/00* (2006.01)

(52) U.S. Cl. .................. 700/186; 700/188; 700/120; 700/69; 700/89; 700/302; 399/200; 399/209; 355/81; 355/84

(58) Field of Classification Search ............... 700/186, 700/188, 120, 69, 89, 302
See application file for complete search history.

(56) References Cited

U.S. PATENT DOCUMENTS

| | | | |
|---|---|---|---|
| 4,332,461 A * | 6/1982 | Cail et al. ................. | 399/200 |
| 4,967,088 A | 10/1990 | Stengl et al. | |
| 6,008,610 A | 12/1999 | Yuan et al. | |
| 6,069,684 A | 5/2000 | Golladay et al. | |
| 6,260,282 B1 | 7/2001 | Yuan et al. | |
| 6,262,427 B1 | 7/2001 | Gordon | |
| 6,690,993 B2 * | 2/2004 | Foulke et al. ................. | 700/218 |
| 6,730,916 B1 * | 5/2004 | Tsuji et al. ................. | 250/442.11 |
| 6,753,947 B2 * | 6/2004 | Meisburger et al. .......... | 355/69 |

OTHER PUBLICATIONS

U.S. Appl. No. 09/757,622, filed Jan. 11, 2001, Roberto B. Wiener.
Levinson, H., Principles of Lithography, The International Society for Optical Engineering, 2001, entire book submitted.
Photolithography, Texas A&M University Electronics Training Program, Texas Engineering Extension Service, 2001, entire manual submitted.

* cited by examiner

*Primary Examiner*—Anthony Knight
*Assistant Examiner*—Thomas Pham
(74) *Attorney, Agent, or Firm*—Sterne, Kessler, Goldstein & Fox P.L.L.C.

(57) ABSTRACT

A lithography system and method for calculating an optimal discrete time trajectory for a movable device is described. A trajectory planner of the lithography system calculates an optimal discrete time trajectory subject to maximum velocity and maximum acceleration constraints. The trajectory planner begins by calculating a continuous time, three-segment trajectory for a reticle stage, a wafer stage or a framing blade, including a first phase for acceleration at the maximum acceleration to the maximum velocity, a second phase for travel at the maximum velocity and a third phase for deceleration at the negative maximum acceleration to a final velocity. Next, the trajectory planner converts said continuous time, three-segment trajectory to a discrete time trajectory. The time of execution of the resulting trajectory is at most three quanta greater than the time of execution of the continuous time trajectory. One advantage of the system is the reduction of scanning times of a lithography system. This advantage increases throughput and reduces manufacturing costs for a lithography system.

20 Claims, 15 Drawing Sheets

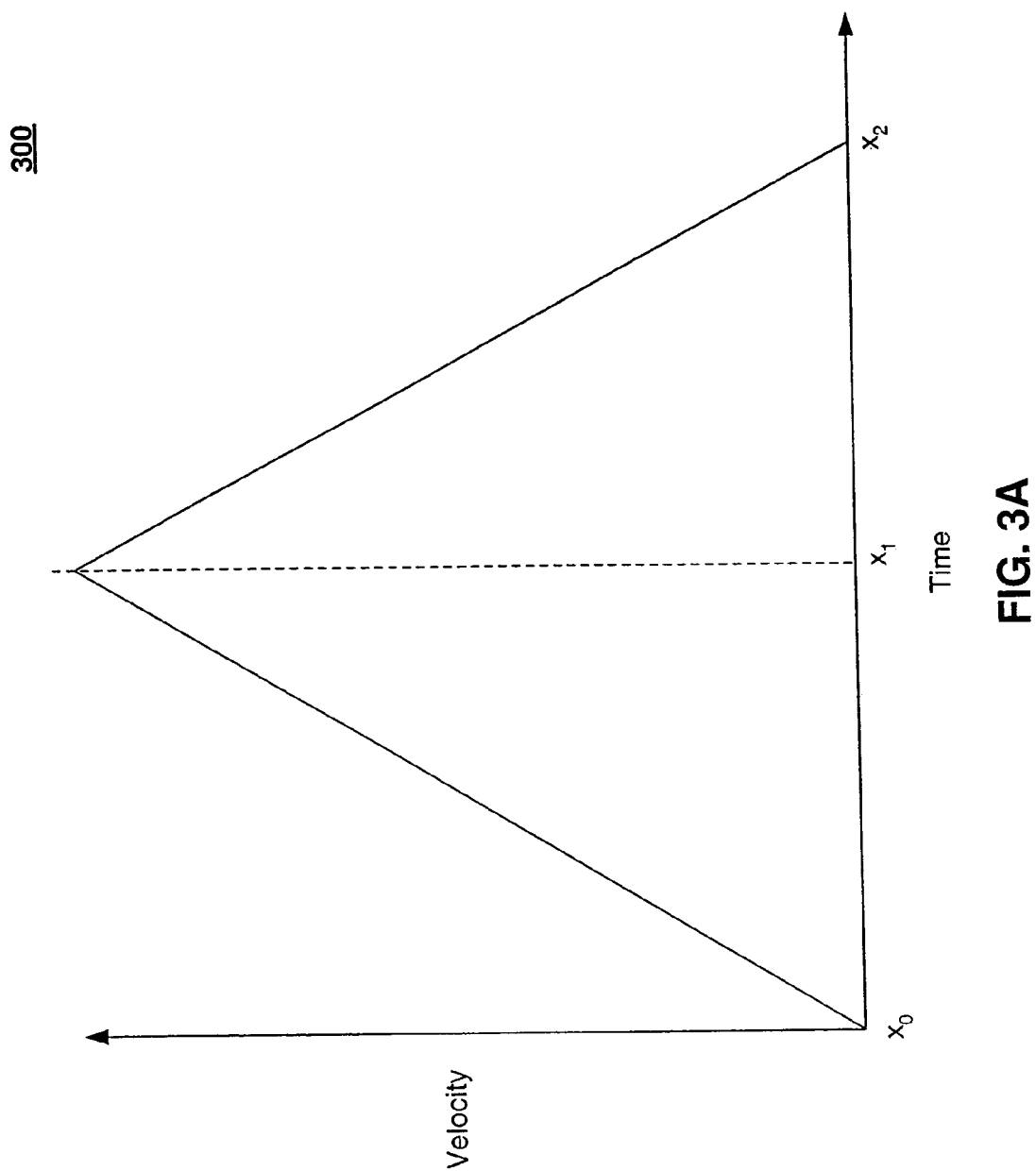

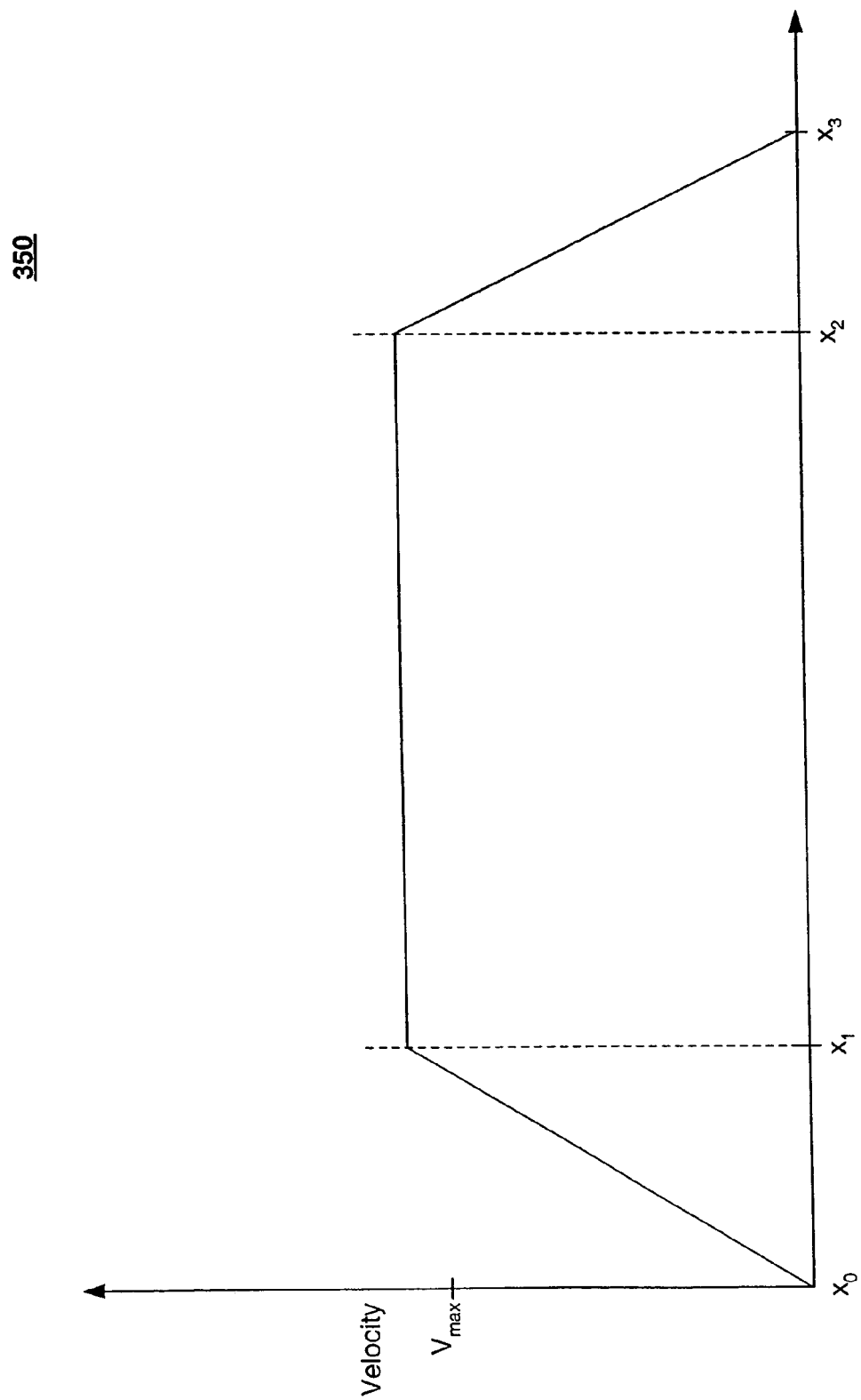

SYSTEM AND METHOD FOR DISCRETE TIME TRAJECTORY PLANNING FOR LITHOGRAPHY

CROSS-REFERENCE TO RELATED APPLICATIONS

This patent application is a continuation of Ser. No. 09/923,397 filed Aug. 8, 2001 (now U.S. Pat. No. 6,760,641 that issued Jul. 6, 2004), which is hereby incorporated by reference herein in its entirety.

This patent application is related to the following commonly-owned U.S. Patent Application: U.S. patent application Ser. No. 09/757,622 (now U.S. Published Application No. 2003-0055855 A1, published Mar. 20, 2003), to Wiener, entitled "Method and System for Efficient and Accurate Filtering and Interpolation," filed Jan. 11, 2001. The foregoing U.S. Patent Application is hereby incorporated by reference in it's entirety.

BACKGROUND OF THE INVENTION

1. Field of the Invention

This invention relates to trajectory planning. More specifically, this invention relates to trajectory planning for a lithography system.

2. Background Art

Many industrial processes involve motion along trajectories that are defined by precise positions at specific times. Photolithography is an example of such a process. In a photolithography process, an illumination source projects an illumination beam. The beam passes through, or is reflected off, a reticle to enable the transfer of a reticle image from the reticle to a substrate, such as a semiconductor wafer.

Scanning techniques are employed in photolithography processes to project a reticle image onto a substrate. These scanning techniques involve moving a reticle across an illumination slot to allow the reticle image to be exposed onto a substrate that is simultaneously moving. Reticles and substrates are disposed on stages that are capable of motion in one or more dimensions.

Long scanning times amount to greater manufacturing costs and less throughput. Therefore, it is desirable to reduce scanning times. In order to decrease the amount of time it takes to execute a trajectory, i.e, execution time, these systems aim to calculate optimal trajectories, i.e, trajectories requiring the least amount of time to execute. The calculation of an optimal continuous trajectory is well known in mathematics. However, a typical lithography system operates in discrete time, not continuous time. That is, a typical lithography system can only receive, process and react to commands in increments of time since the sampling rate of the command and control systems is limited. Further, a typical lithography system is restricted by maximum velocity and maximum acceleration constraints.

Accordingly, what is needed is a system and method for calculating optimal discrete time trajectories for a lithography system.

BRIEF SUMMARY OF THE INVENTION

The present invention relates to a lithography system and method for calculating an optimal discrete time trajectory.

In an embodiment of the present invention, a trajectory planner of the lithography system calculates an optimal discrete time trajectory subject to maximum velocity and maximum acceleration constraints. The trajectory planner begins by calculating a continuous time, three-segment trajectory for a movable device, including a first phase for acceleration at the maximum acceleration to the maximum velocity, a second phase for travel at the maximum velocity and a third phase for deceleration at the negative maximum acceleration to a final velocity. The movable device can be a wafer stage, a reticle stage or a framing blade. Next, the trajectory planner converts said continuous time, three-segment trajectory to a discrete time trajectory. The time of execution of the resulting trajectory is at most three quanta greater than the time of execution of said continuous time, three-segment trajectory.

The present invention reduces scanning times in a lithography system. This advantage increases throughput for a lithography system and reduces manufacturing costs.

Further features and advantages of the invention as well as the structure and operation of various embodiments of the present invention are described in detail below with reference to the accompanying drawings.

BRIEF DESCRIPTION OF THE FIGURES

The features and advantages of the present invention will become more apparent from the detailed description set forth below when taken in conjunction with the drawings in which like reference numbers indicate identical or functionally similar elements. Additionally, the left-most digit of a reference number identifies the drawing in which the reference number first appears.

FIG. 3A is a graph illustrating a continuous, three-segment trajectory subject to no constraints, in an embodiment of the present invention.

FIG. 3B is a graph illustrating a continuous, three-segment trajectory subject to velocity and acceleration constraints, in an embodiment of the present invention.

DETAILED DESCRIPTION OF THE INVENTION

Table of Contents system and method for DISCRETE TIME TRAJECTORY PLANNing for LITHOGRAPHY
   CROSS-REFERENCE TO RELATED APPLICATIONS
   BACKGROUND OF THE INVENTION
Field of the Invention
Background Art
   BRIEF SUMMARY OF THE INVENTION
   BRIEF DESCRIPTION OF THE FIGURES
   DETAILED DESCRIPTION OF THE INVENTION
   DETAILED DESCRIPTION OF THE INVENTION I. Overview
  A. Definition
  B. General Considerations
II. Lithography System Architecture
III. Trajectory Planning
  A. Optimal Trajectories
  B. Trajectory Calculation
    1. Calculation of a Continuous Trajectory
    2. Quantization.
    3. Special Cases
IV. Computer System
V. Conclusion system and method for DISCRETE TIME TRAJECTORY PLANNing for LITHOGRAPHY
ABSTRACT OF THE DISCLOSURE

DETAILED DESCRIPTION OF THE INVENTION

I. Overview

The present invention relates to a lithography system and method for calculating an optimal discrete time trajectory. The present invention allows for a more efficient and timely production of semiconductors.

A. Definition

The following definitions are provided for illustrative purposes only. Alternative definitions for the listed terms will be apparent to the persons skilled in the relevant art(s) based on the discussion contained herein, and fall within the scope and spirit of embodiments of the invention.

The term "trajectory" or "profile" refers to a path that is traveled by a projectile or a movable device.

The term "quantum" refers to one unit of measurement. With reference to a trajectory, a quantum is one time increment. A time increment is also referred to as a "quantization interval."

The term "quantize" refers to the conversion of a continuous function or curve into a discrete function or curve. In the present invention, a continuous curve is quantized, or converted, to a discrete curve in accordance with the sampling rate of the command and control system of a lithography system.

B. General Considerations

The present invention is described in terms of the examples contained herein. This is for convenience only and is not intended to limit the application of the present invention. In fact, after reading the following description, it will be apparent to one skilled in the relevant art(s) how to implement the following invention in alternative embodiments.

II. Lithography System Architecture

Figure 1:
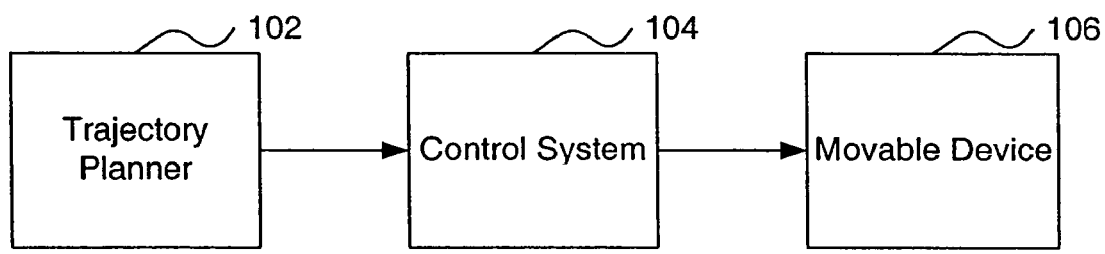
FIG. 1 is a block diagram illustrating the architecture of a lithography system, in an embodiment of the present invention, showing connectivity among the various components.

FIG. 1 shows a block diagram illustrating the architecture of a lithography system 100, in an embodiment of the present invention, showing connectivity among the various components. System 100 includes a trajectory planner 102, a control system 104 and a movable device 106. Movable device 106 can be any device that can be moved during the scanning process in a lithography tool, such as a reticle stage or a wafer stage. Trajectory planner 102 designs trajectories in accordance with user-specified requirements. This design process results in the generation of commands that define a trajectory for a movable device in a lithography tool. Trajectory planner 102 is implemented as a computer program product that is executed by a double precision computer. However, trajectory planner 102 can also be implemented in hardware and/or firmware. Trajectory planner 102 designs these trajectories in an off-line process. Thus, in the case of a lithography system, commands can be generated prior to commencement of substrate stage or reticle stage scanning operations. Control system 102 is responsible for implementing the trajectories designed by trajectory planner 102. Control system 102 can be any lithography control system that is known to one of ordinary skill in the art.

Figure 2:
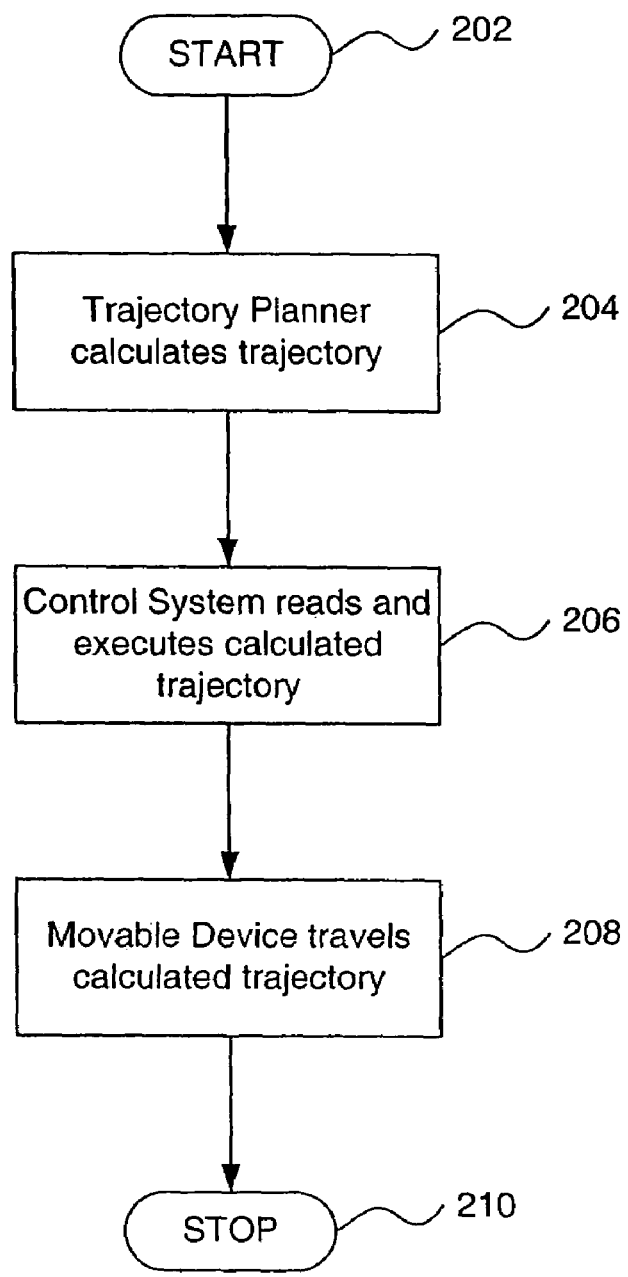
FIG. 2 is a flowchart depicting an embodiment of the operation and control flow of a lithography system of the present invention.

FIG. 2 shows a flowchart depicting an embodiment of the operation and control flow 200 of a lithography system of the present invention. FIG. 2 shows how a trajectory is calculated and implemented in a lithography system, such as system 100. Control flow 200 begins at step 202, with control passing immediately to step 204.

In step 204, trajectory planner 102 calculates the intended trajectory of movable device 106. The method by which trajectory planner 102 calculates the intended trajectory is described in greater detail below.

In step 206, control system 104 implements the trajectory calculated in step 204 above.

In step 208, movable device 106 travels the trajectory calculated in step 204 and implemented by control system 104 in step 206.

In step 210, flow 500 ceases.

III. Trajectory Planning

A. Optimal Trajectories

FIG. 3A shows a graph 300 illustrating a continuous two-phase trajectory. Graph 300 is a velocity versus time graph showing the optimal trajectory for an object moving from a first position to a second position, along one axis. There are no velocity or acceleration constraints shown in graph 300 other than the fact that acceleration is finite.

Graph 300 shows an object beginning at time $x_0$ at a first position and velocity. At time $x_0$, the object is at zero acceleration. Then, the object accelerates at maximum acceleration up to time $x_1$. At time $x_1$, the first segment of the trajectory ends and the second segment of the trajectory begins. Then, the object decelerates at minimum acceleration (the negative of the previous, maximum acceleration) until the object is located at the desired second position and velocity at time $x_2$. At time $x_2$, the object is at zero acceleration.

It should be noted that, if the initial velocity at $x_0$ is the same as the desired velocity at $x_2$, then $x_1$ is substantially at the midpoint between times $x_0$ and $x_2$ and at the midpoint between the first position and the second position. This is because 1) the absolute value of the maximum acceleration of the first segment is identical to the absolute value of the deceleration of the second segment and 2) the starting condition (at rest) is the same as the end condition. Thus, the trajectory is symmetrical.

FIG. 3B shows a graph 350 illustrating a continuous, three-segment trajectory. Graph 350 is a velocity versus time graph showing the optimal trajectory for an object moving from a first position to a second position, along one axis, subject to constraints. The trajectory of graph 350 is subject to velocity and acceleration constraints. That is, the trajectory of graph 350 has a maximum velocity and a maximum acceleration.

Graph 350 shows an object beginning at time $x_0$ at the first position and velocity. At time $x_0$, the object is at zero acceleration. Then, the object accelerates at the maximum acceleration until the maximum velocity is reached at time $x_1$. At time $x_1$, the first segment of the trajectory ends and the second segment of the trajectory begins. Then, the object travels at the maximum velocity and zero acceleration until time $x_2$. At time $x_2$, the second segment of the trajectory ends and the third segment of the trajectory begins. Then, the object decelerates at the negative maximum acceleration (the negative of the previous, maximum acceleration) until the object reaches the desired second position and velocity at time $x_3$. At time $x_3$, the object is at zero acceleration.

It should noted that the first segment of the trajectory is substantially congruent to the third segment of the trajectory. This is because 1) the absolute value of the acceleration of the first segment is identical to the absolute value of the deceleration of the third segment and 2) the starting condition is the same as the end condition. Thus, the trajectory is symmetrical.

B. Trajectory Calculation

Figure 4:
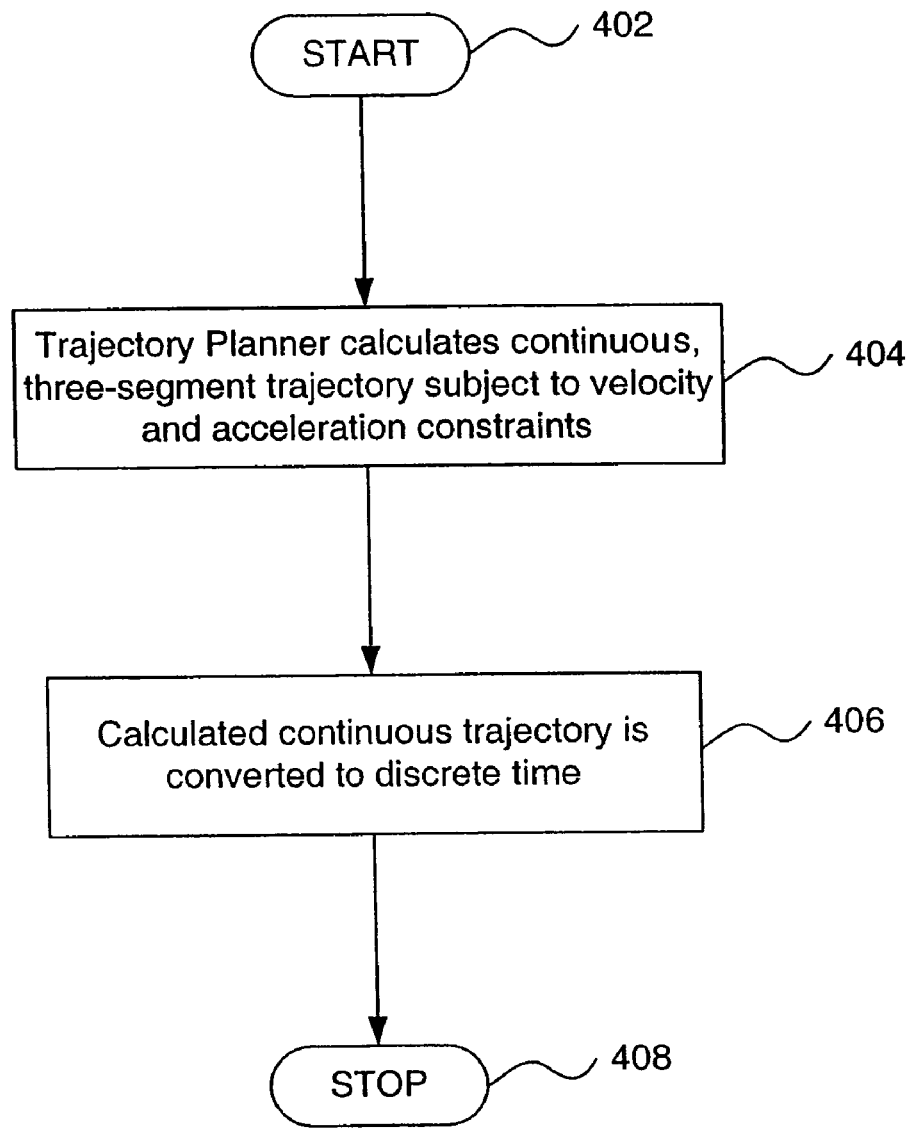
FIG. 4 is a flowchart depicting an embodiment of the operation and control flow of the trajectory calculation process of the present invention.

FIG. 4 shows a flowchart depicting an embodiment of the operation and control flow 400 of the trajectory calculation process of the present invention. FIG. 4 shows how a trajectory is calculated by a trajectory planner, such as trajectory planner 102, in a lithography system, such as system 100. Flow 400 describes in greater detail how a trajectory is planned, as show in step 202 of FIG. 2. Control flow 400 begins at step 402, with control passing immediately to step 404.

In step 404, trajectory planner 102 calculates a continuous, three segment trajectory subject to velocity and acceleration constraints. A continuous, three segment trajectory subject to velocity and acceleration constraints is described in greater detail above (see FIG. 3B). The calculation of a continuous, three segment trajectory subject to velocity and acceleration constraints is described in greater detail below.

In step 406, the trajectory calculated in step 404 above is quantized. Quantization of a continuous function or curve is described in greater detail below.

In step 408, flow 400 ceases.

1. Calculation of a Continuous Trajectory

This section describes in greater detail the calculation of a continuous, three segment trajectory subject to velocity and acceleration constraints, as performed by trajectory planner 102 in step 404 above (see FIG. 4).

Figure 5:
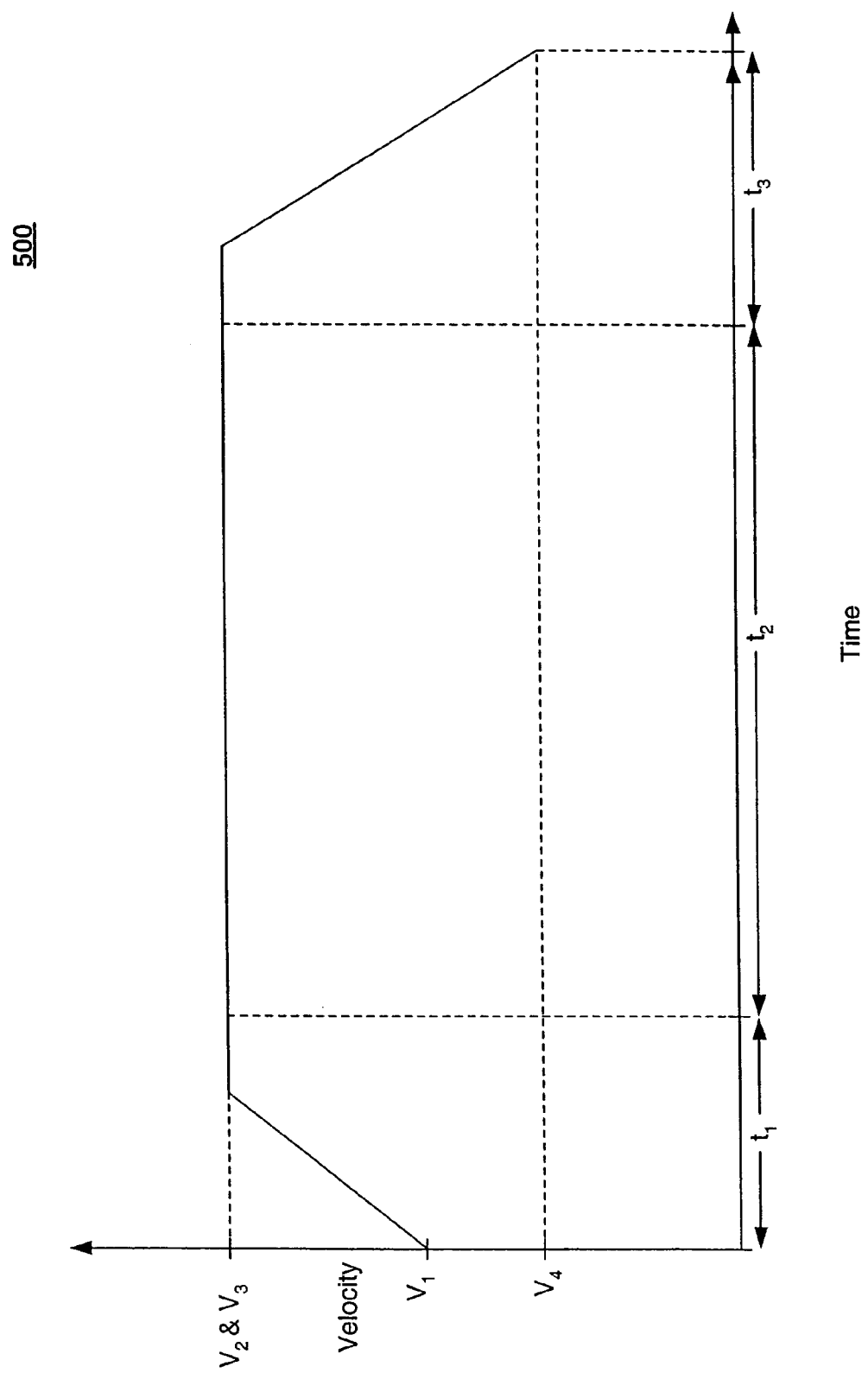
FIG. 5 is a graph illustrating an alternative, continuous, three-segment trajectory subject to velocity and acceleration constraints, in an embodiment of the present invention.

FIG. 5 shows a graph 500 illustrating a continuous, three-segment trajectory, similar to graph 350. Graph 500 is a velocity versus time graph showing the optimal trajectory for an object moving from a first position to a second position, subject to constraints. The trajectory of graph 500 is subject to velocity and acceleration constraints. A continuous, three-segment trajectory subject to constraints is described in greater detail above in FIG. 3B. In FIG. 5:

$v_1$ is the initial velocity of the object
$v_2$ is the second velocity of the object
$v_3$ is the third velocity of the object
$v_4$ is the fourth or end velocity of the object
$t_1$ is the duration of the first segment of the trajectory
$t_2$ is the duration of the second segment of the trajectory
$t_3$ is the duration of the third segment of the trajectory Also associated with FIG. 5 (but not shown):
$s_0$ is the initial position of the object (associated with the beginning of the first segment of the trajectory)
$s_1$ is the second position of the object (associated with the beginning of the second segment of the trajectory)
$s_2$ is the third position of the object (associated with the beginning of the third segment of the trajectory)
$s_3$ is the fourth position of the object (associated with the end of the third segment of the trajectory)
$a_1$ is the first acceleration of the object (associated with the first segment of the trajectory)
$a_2$ is the second acceleration of the object (associated with the second segment of the trajectory
$a_3$ is the third acceleration of the object (associated with the third segment of the trajectory
$v_{max}$ is the maximum velocity allowed for the object, i.e., a velocity constraint
$a_{max}$ is the maximum acceleration allowed for the object, i.e., an acceleration constraint
d is the total desired displacement of the object, i.e., $d = s_1 + s_2 + s_3$ Because FIG. 5 represents an "optimal" continuous trajectory, we assume that:

$$a_2 = 0$$

$$v_2 = v_3$$

$$a_1 = a_{max}$$

$$a_3 = -a_{max}$$

As a result of the velocity and acceleration constraints, we see that:
$v_i$ is less than or equal to the maximum velocity, i.e. $|v_i| \leq v_{max}$
$a_i$ is less than or equal to the maximum acceleration, i.e. $|a_i| \leq a_{max}$ In light of the above, we see that:

$$\left. \begin{array}{l} v_2 = a_1 t_1 + v_1 \\ v_3 = a_2 t_2 + v_2 \\ v_4 = a_3 t_3 + v_3 \end{array} \right\} \quad (1)$$

$$\left. \begin{array}{l} s_1 = \frac{1}{2} a_1 t_1^2 + v_1 t_1 \\ s_2 = \frac{1}{2} a_2 t_2^2 + v_2 t_2 \\ s_3 = \frac{1}{2} a_3 t_3^2 + v_3 t_3 \end{array} \right\} \quad (2)$$

If we combine equations (1) and (2), then:

$$t_1 = -\frac{v_1 - 1/2\sqrt{2v_4^2 + 2v_1^2 + 4da_{max}}}{a_{max}} \quad (3a)$$

Or, if $t_1$ is negative:

$$t_1 = -\frac{v_1 + 1/2\sqrt{2v_4^2 + 2v_1^2 + 4da_{max}}}{a_{max}} \quad (3b)$$

Similarly, for $t_3$:

$$t_3 = \frac{-v_4 + 1/2\sqrt{2v_4^2 + 2v_1^2 + 4da_{max}}}{a_{max}} \quad (4a)$$

$$t_3 = \frac{-v_4 - 1/2\sqrt{2v_4^2 + 2v_1^2 + 4da_{max}}}{a_{max}} \quad (4b)$$

Thus, the "optimal" $v_2$ velocity can be calculated as:

$$v_{2optimal} = v_1 + a_1 t_1 \quad (5)$$

If the absolute value of $v_{2optimal}$ is greater than the absolute value of maximum velocity $v_{max}$, then, in order to meet the velocity constraint, let:

$$\left. \begin{array}{l} v_2 = v_{max} \\ t_1 = \dfrac{v_{max} - v_1}{a_1} \\ t_3 = -\dfrac{v_4 - v_{max}}{a_{max}} \\ v_3 = v_{max} \\ t_2 = \dfrac{1}{2}\dfrac{(-2v_{max}^2 + v_1^2 + v_4^2 + 2da_{max})}{v_{max}a_{max}} \end{array} \right\} \quad (6)$$

where $v_{max}$ in this case has the appropriate sign. That is, if the three-segment trajectory involves an initial negative acceleration, then $v_{max}$ must be negative. Further, if the three-segment trajectory involves an initial positive acceleration, then $v_{max}$ must be positive.

If the absolute value of $v_{2optimal}$ is not greater than the maximum velocity $v_{max}$, then $t_1$ is given by equations (3a) or (3b) and $t_3$ is given by equations (4a) or (4b). As a result, $t_2=0$ and $v_2$ is given by equation (5).

The following conditions should be noted. First, equations (6) define the ideal trajectories for a velocity and acceleration constrained problem. Second, notice that the closer $v_1$ and $v_4$ are to $v_{max}$, the smaller $t_1$ and $t_3$ become. Third, note that both $t_1$ and/or $t_3$ exist, both are positive and both are real if the element in the square root of equations (3a)/(3b) and (4a)/(4b) adheres to the following inequalities:

$$(v_1^2 + v_4^2) > 2da_{max} \quad (7)$$

$$a_{max} > 0$$

It should be noted that if $a_{max}<0$, usually equations (3b) and (4b) are used to obtain the proper result. Lastly, $t_3$ and $t_2$ may be negligible if:

$$v_4 \cong v_1 + t_1 a_{max} \text{ and}$$

$$d \cong s_1 \cong \dfrac{1}{2} a_{a\,max} t_1^2 + v_1 t_1$$

Furthermore, $t_1$ and $t_3$ might be negligible if:

$$v_1 \cong v_2 \cong v_3 \cong v_4$$

So far, the velocity and acceleration constraints have been easily met by the choice of $a_1$ and $a_3$ and equations (5) and (6). At this point, however, $t_1$, $t_2$ and $t_3$ are real numbers, not necessarily integer multiples of a quantization interval. The following section deals with an additional constraint—the quantization of $t_1$, $t_2$ and $t_3$.

2. Quantization.

This section describes in greater detail the quantization of the continuous, three-segment trajectory defined above, as performed by trajectory planner 102 in step 406 above (see FIG. 4).

In this section, a new constraint is added to the continuous, three-segment trajectory defined above:

$t_i$ is an integer multiple of a quantization interval T, i.e., $$t_i = k*T (i=1, 2, 3)$$

In order to meet this constraint, $t_1$, $t_2$ and $t_3$ must be quantized, i.e., converted to an integer multiple of the quantization interval T without violating the maximum velocity and acceleration constraints.

Assume that instead of using $t_1$ to $t_3$ calculated in the previous section, a set of times $t_{1calc}$ to $t_{3calc}$ are chosen as follows:

if ($t_1 \geq T$ and $t_2 > T$ and $t_3 \geq T$), then let:

$t_{1calc} = t_1;$ $t_{2calc} = t_2;$ $t_{3calc} = t_3;$ if ($t_1 \geq T$ and $t_3 \geq T$ and $t_2 < T$), then let:

$t_{1calc} = t_1 + (t_2/2);$ $t_{2calc} = 0;$ $t_{3calc} = t_3 + (t_2/2);$ if ($t_3 \geq T$ and $t_1 < T$ and $t_2 \geq T$), then let:

$t_{1calc} = t_1 + t_2;$ $t_{2calc} = 0;$ $t_{3calc} = t_3;$ if ($t_1 \geq T$ and $t_3 < T$ and $t_2 \geq T$), then let:

$$t_{1calc} = t_1. \quad (8a)$$

Notice that the following two cases are not covered:

($t_3 \geq T$ and $t_1 < T$ and $t_2 < T$)

($t_1 \geq T$ and $t_3 < T$ and $t_2 < T$)

Both of these cases indicate that applying a single acceleration (or deceleration) of the maximum magnitude "almost" covers the total desired displacement d, and that the remaining required adjustments in position and/or velocity are smaller than the ones that can be performed during a multiple of the quantization interval T. The most straightforward way to deal with these cases is to accelerate or decelerate in order to meet the target velocity; then generate a new set of trajectories in order to compensate for the displacement error. The reason for doing this will become obvious in the following.

For the cases described in equations (8a), the new accelerations $a_{1calc}$ and $a_{3calc}$ can be calculated from a modified version of (1) and (2):

$$\left. \begin{array}{l} v_{2calc} = a_{1calc}t_{1calc} + v_1 \\ v_{3calc} = a_2 t_{2calc} + v_{2calc} \\ v_4 = a_{3calc}t_{3calc} + v_{3calc} \end{array} \right\} \quad (8b)$$

$$\left. \begin{array}{l} s_{1calc} = \dfrac{1}{2} a_{1calc} t_{1calc}^2 + v_1 t_{1calc} \\ s_{2calc} = \dfrac{1}{2} a_2 t_{2calc}^2 + v_{2calc} t_{2calc} \\ s_{3calc} = \dfrac{1}{2} a_{3calc} t_{3calc}^2 + v_{3calc} t_{3calc} \end{array} \right\} \quad (8c)$$

Note that:

$$d = s_1 + s_2 + s_3 = s_{1calc} + s_{2calc} + s_{3calc}$$

Then, we solve for $a_{1calc}$ and $a_{3calc}$:

$$a_{1calc} = \frac{(-2v_1 t_{1calc} - 2t_{2calc}v_1 - t_{3calc}v_1 - t_{3calc}v_4 + 2d)}{t_{1calc}(t_{1calc} + 2t_{2calc} + t_{3calc})} \quad (8d)$$

$$a_{3calc} = \frac{(v_1 t_{1calc} + 2t_{3calc}v_4 - 2d + v_4 t_{1calc} + 2v_4 t_{2calc})}{(t_{1calc} + 2t_{2calc} + t_{3calc})t_{3calc}}$$

Now let $t_{1q}$, $t_{2q}$ and $t_{3q}$ be the quantized counterpart of $t_{1calc}$, $t_{2calc}$ and $t_{3calc}$, i.e.:

$$t_{iq} = n_i * T;\ i=1, 2, 3;\ n=0, 1, 2, \quad (9)$$

Notice that $t_{iq}$ can also be represented in terms of $t_{icalc}$ as:

$$t_{iq} = t_{icalc} + dt_i T;\ i=1, 2, 3;\ (0 \le dt_i < 1) \quad (10)$$

Where $$dt_i = t_{iq} - t_{icalc} = n_i * T - t_{icalc} \quad (11)$$

Also notice that if $t_i$ is rounded towards infinity, then $$\text{ceil}(x) = \begin{cases} x & \text{only if } x \text{ is an integer} \\ y & \text{else} \end{cases} \quad (12)$$

where y is equal to truncating the decimal part of x+1.
Then (10) can be expressed as:

$$t_{iq} = t_{icalc} + dt_i T;\ i=1, 2, 3 \quad (13a)$$

$$t_{icalc} = K_i T\ (K_i=0, 1, 2, \ldots) \quad (13b)$$

$$t_{iq} = (K_i + dt_1)T;\ i=1, 2, 3 \quad (13c)$$

Where $K_i$ and $d_i$ are identically equal to zero only if $t_{icalc}$ is equal to zero.

Notice from equations (8a), (9), (10), (11) and (13) that:

$$t_{1q} + t_{2q} + t_{3q} < t_{1calc} + t_{2calc} + t_{3calc} + 3T \le t_1 + t_2 + t_3 + 3T \quad (14)$$

Thus, equation (14) shows that the quantized execution time of the trajectory $(t_{1q} + t_{2q} + t_{3q})$ is at most three quanta (3T) longer than the execution time described by the continuous, optimal solution $(t_1 + t_2 + t_3)$.

Given equation (14), the goal of quantization is to recalculate $a_1$ and $a_3$ as to still satisfy the velocity and acceleration constraints. Let the values of these new accelerations be $a_{1q}$ and $a_{3q}$, respectively. Then, equations (1) and (2) can be re written as:

$$\left. \begin{array}{l} v_{2q} = a_{1q} t_{1q} + v_1 \\ v_{3q} = a_2 t_{2q} + v_{2q} \\ v_4 = a_{3q} t_{3q} + v_{3q} \end{array} \right\} \quad (13)$$

$$\left. \begin{array}{l} s_{1q} = \frac{1}{2} a_{1q} t_{1q}^2 + v_1 t_{1q} \\ s_{2q} = \frac{1}{2} a_2 t_{2q}^2 + v_{2q} t_{2q} \\ s_{3q} = \frac{1}{2} a_{3q} t_{3q}^2 + v_{3q} t_{3q} \end{array} \right\} \quad (14)$$

(Note that $a_{iq}$ are not quantized.)

Note that $a_2=0$ in equations (8a), (8b), (13) and (14). Then, we solve equations (8b), (8c), (13) and (14) for $a_{1q}$ and $a_{3q}$. Note that $v_{2q} = v_{2calc}$, in order to guarantee the velocity constraint, and that $s_{1q} + s_{2q} + s_{3q} = s_{1calc} + s_{2calc} + s_{3calc} = s_1 + s_2 + s_3 = d$. Then, (8d) is substituted for $a_{1calc}$ and $a_{3calc}$. Subsequently:

$$a_{1q} = -\frac{t_{3q}v_4 - 2d + (t_{3q} + 2t_{1q} + 2t_{2q})v_1}{t_{1q}(t_{3q} + t_{1q} + 2t_{2q})} \quad (15)$$

$$a_{3q} = \frac{(2t_{3q} + t_{1q} + 2t_{2q})v_4 + v_1 t_{1q} - 2d}{t_{3q}(t_{3q} + t_{1q} + 2t_{2q})}$$

Equations (15), are easy to implement but do not shed any light on the relation between the quantization interval and the magnitude of $a_{1q}$ and $a_{3q}$.

In an alternative approach, we solve (8b), (8c) and (14) for $a_{1q}$ and $a_{3q}$. Note that $v_{2q} = v_{2calc}$, in order to guarantee the velocity constraint, and that $s_{1q} + s_{2q} + s_{3q} = s_{1calc} + s_{2calc} + s_{3calc} = s_1 + s_2 + s_3 = d$. However, (8d) is not substituted for $a_{1calc}$ and $a_{3calc}$. Subsequently:

$$a_{1q} = -\frac{\begin{array}{l} t_{3q} a_{1calc} t_{1calc} + t_{3q} t_{3calc} a_{3calc} - a_{1calc} t_{1calc}^2 - \\ 2v_1 t_{1calc} - 2t_{2calc} a_{1calc} t_{1calc} - 2t_{2calc} v_1 - a_{3calc} t_{3calc}^2 \\ -2t_{3calc} a_{1calc} t_{1calc} - 2t_{3calc} v_1 + 2v_1 t_{1q} + 2t_{2q} v_1 + 2t_{3q} v_1 \\ 2t_{3q} a_{1calc} t_{1calc} + 2t_{3q} t_{3calc} a_{3calc} - a_{1calc} t_{1calc}^2 - \end{array}}{t_{1q}(t_{3q} + t_{1q} + 2t_{2q})}$$

$$a_{3q} = \frac{\begin{array}{l} 2v_1 t_{1calc} - 2t_{2calc} a_{1calc} t_{1calc} - 2t_{2calc} v_1 - a_{3calc} t_{3calc}^2 \\ -2t_{3calc} a_{1calc} t_{1calc} - 2t_{3calc} v_1 + 2v_1 t_{1q} + 2t_{2q} v_1 + 2t_{3q} v_1 + \\ a_{1calc} t_{1calc} t_{1q} + 2a_{1calc} t_{1calc} t_{2q} + t_{3calc} a_{3calc} t_{1q} + 2t_{3calc} a_{3calc} t_{2q} \end{array}}{(t_{3q} + t_{1q} + 2t_{2q})t_{3q}}$$

Clearly these equations are too complicated as to shed any light on the behavior of $a_{1q}$ an $a_{3q}$ as a function of the calculated times, however they can be simplified to:

$$a_{1q} = -\frac{A_1 a_{1calc} + B_1 a_{3calc} + C_1 v_1}{t_{1q}(t_{3q} + t_{1q} + 2t_{2q})} \quad (16)$$

$$a_{3q} = \frac{A_3 a_{1calc} + B_3 a_{3calc} + C_3 v_1}{t_{3q}(t_{3q} + t_{1q} + 2t_{2q})}$$

Figure 7A:
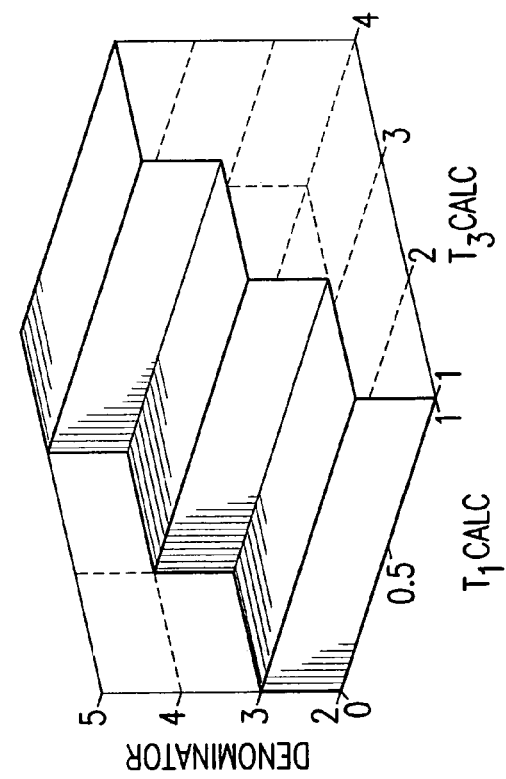
FIGS. 7A–7P are a collection of graphic surfaces representing the values of multi-dimensional variables.
Figure 7B:
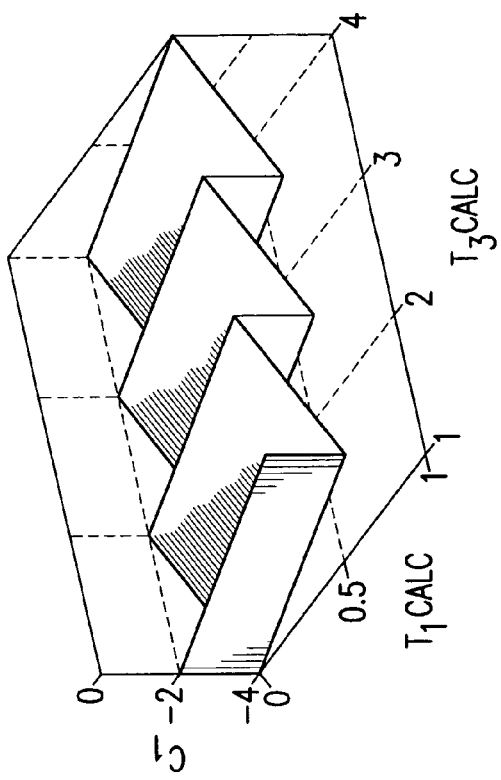
Figure 7D:
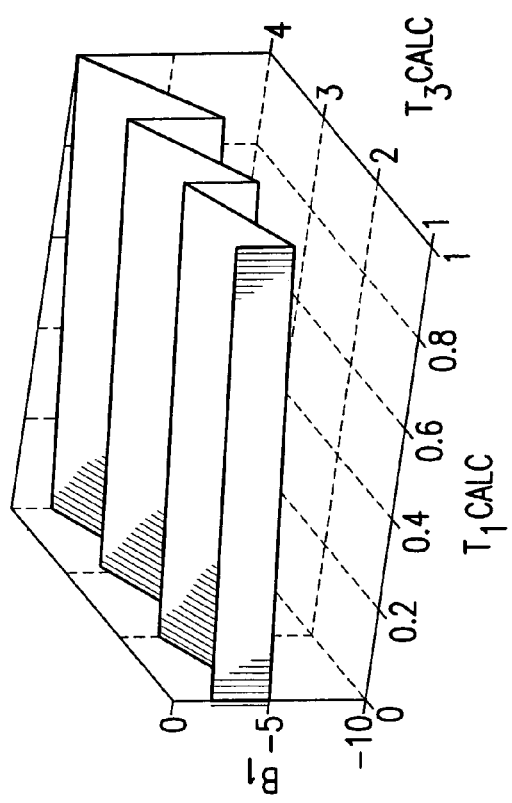
Figure 7C:
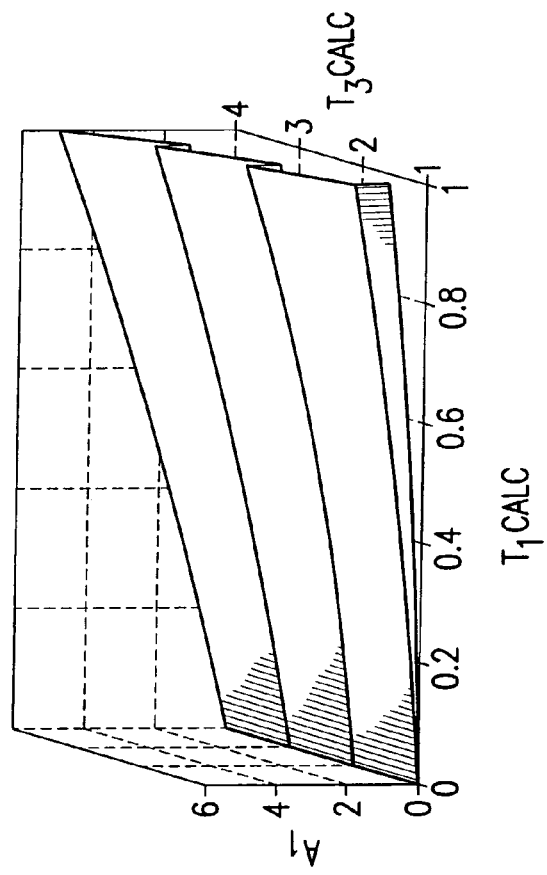
Figure 7F:
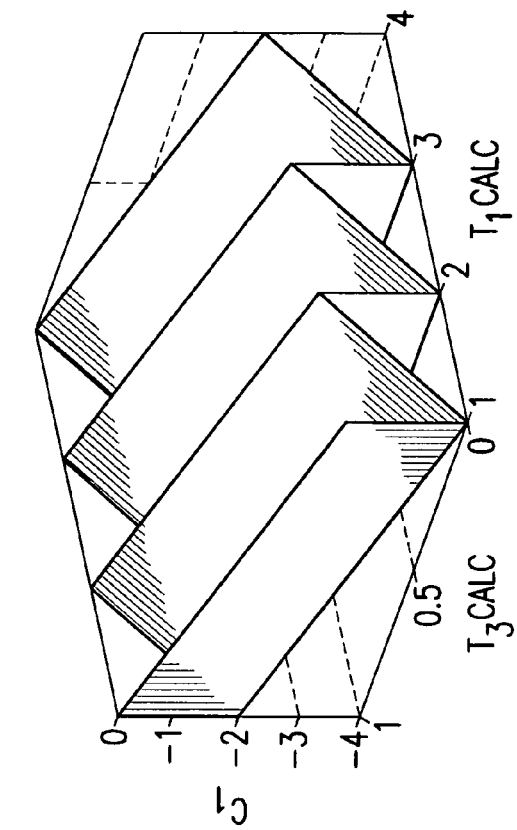
Figure 7E:
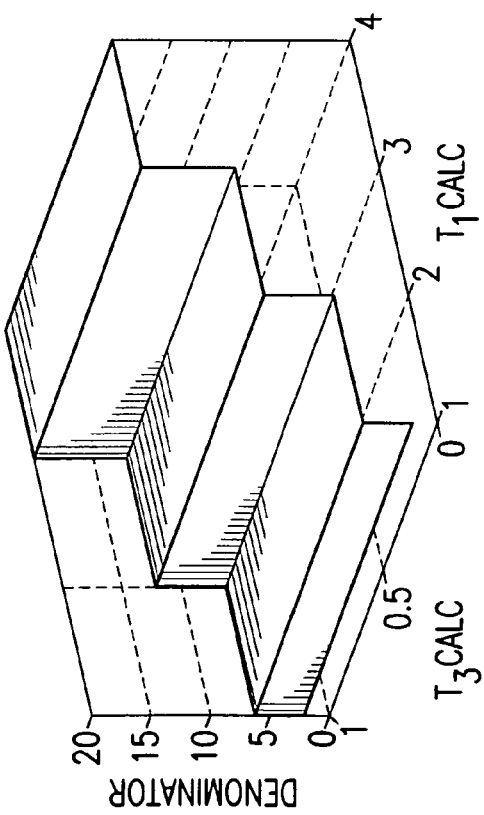
Figure 7H:
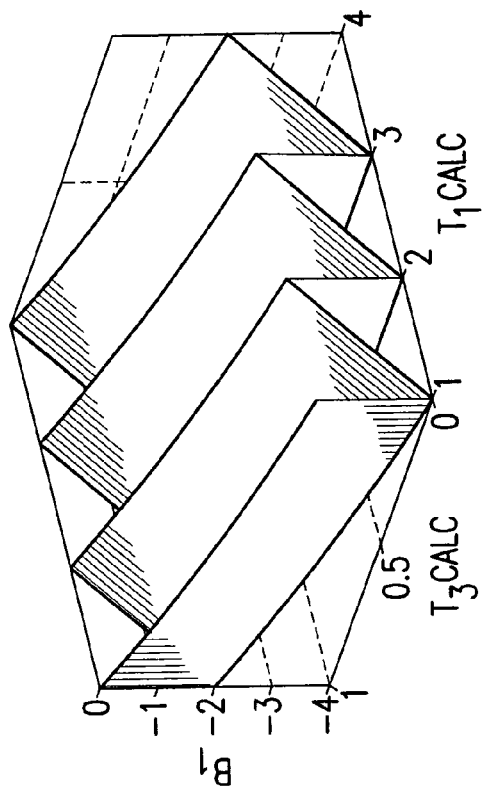
Figure 7G:
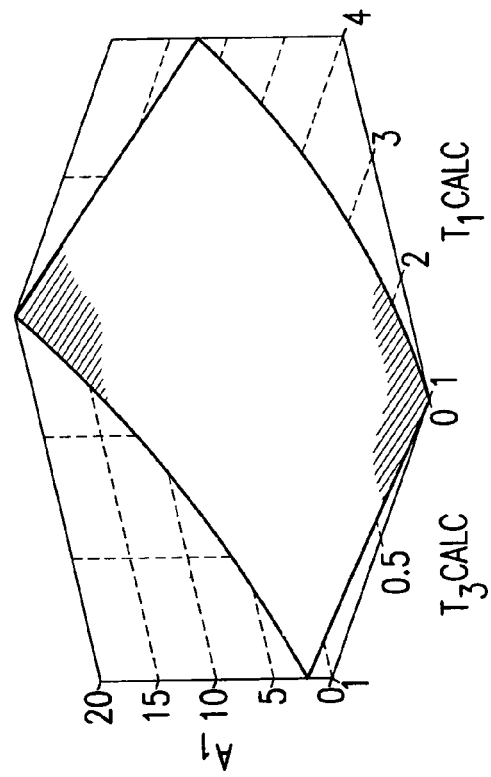
Figure 7J:
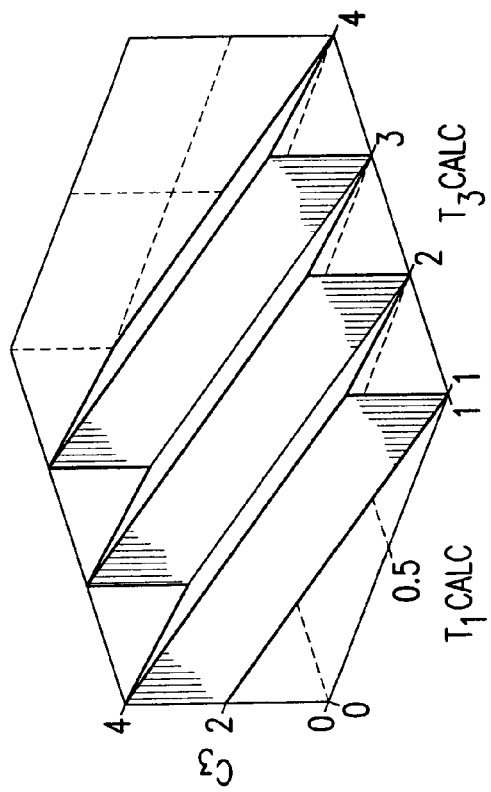
Figure 7I:
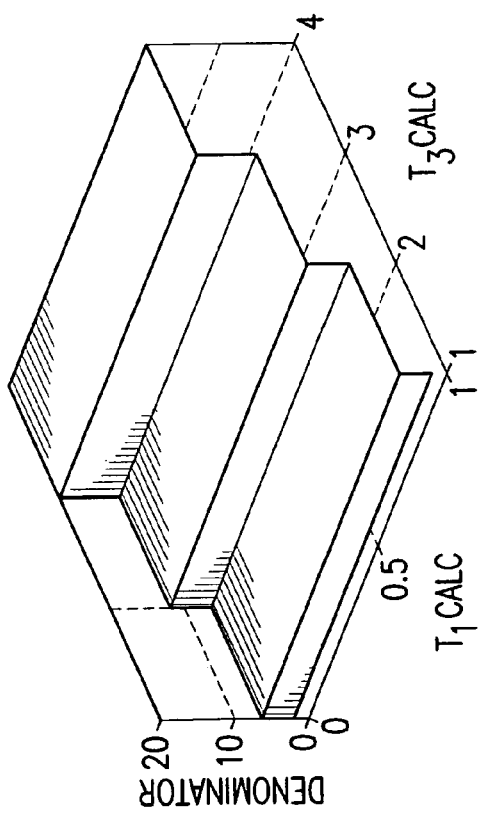
Figure 7L:
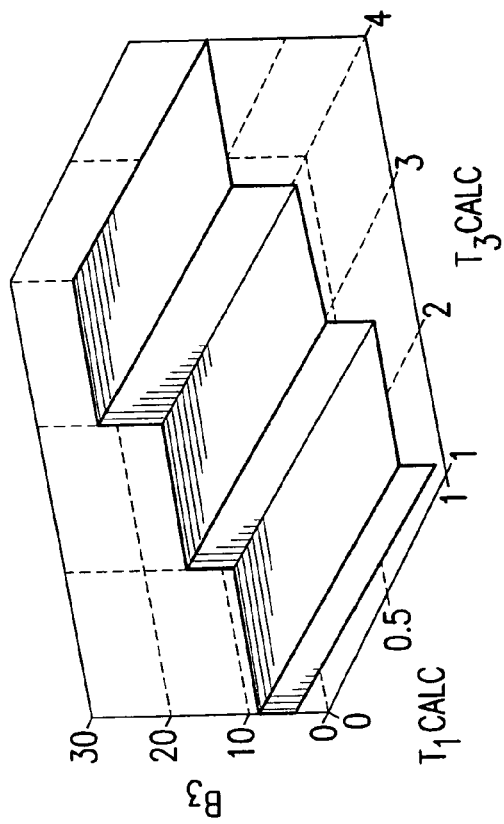
Figure 7K:
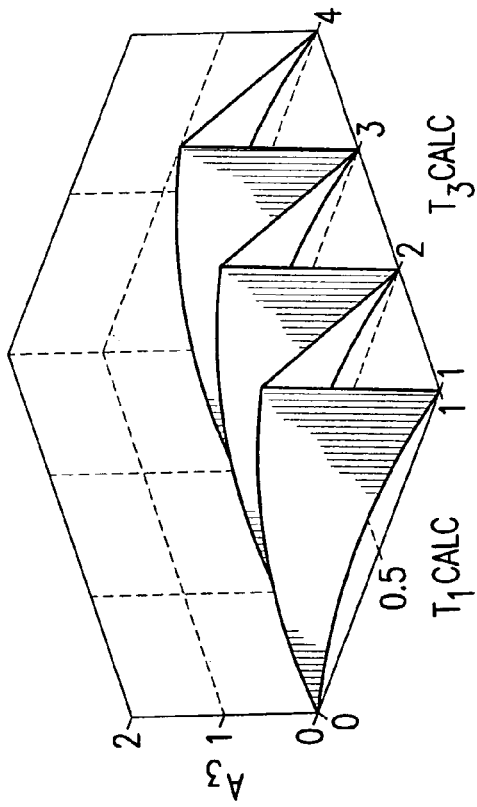
Figure 7N:
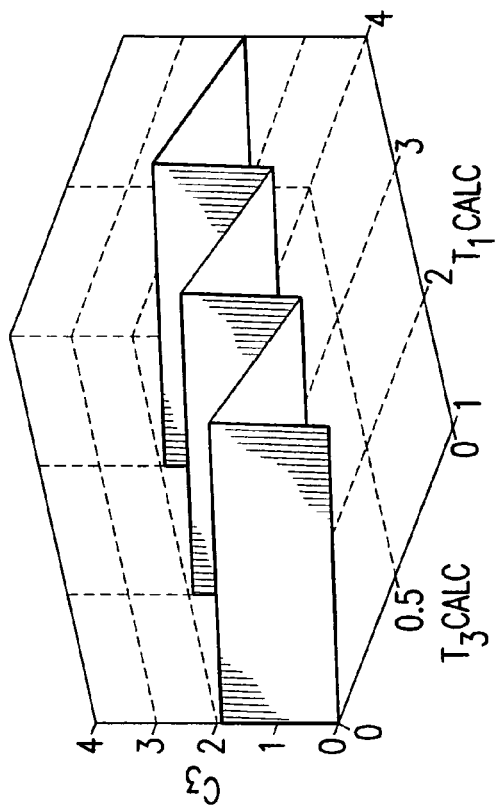
Figure 7M:
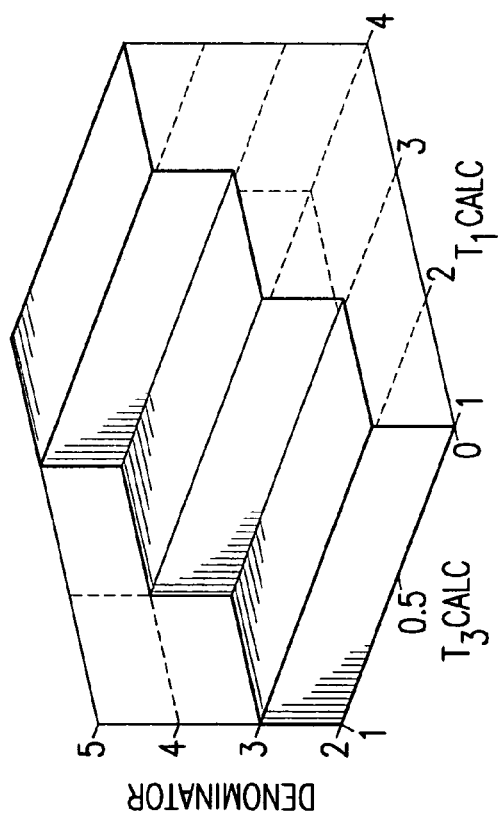
Figure 7P:
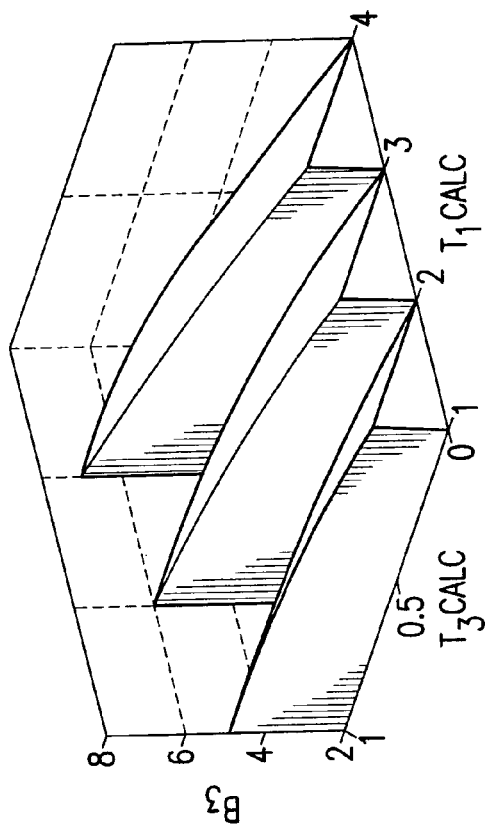
Figure 7O:
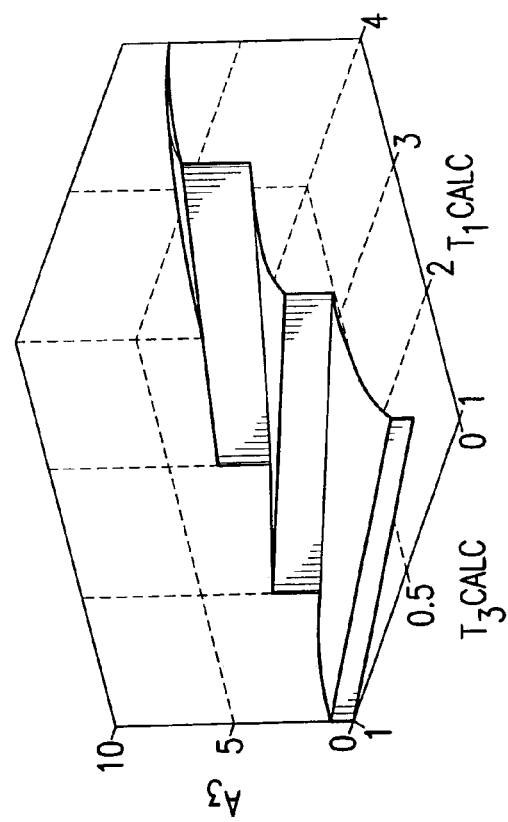

FIGS. 7A–7P show a collection of graphic surfaces representing the values of variables $A_1$, $B_1$ and $C_1$ versus varying values of $t_1$ and $t_3$, as described in equations (16).

3. Special Cases

Equations (15), (16) and (8d) show the effect of small displacements, i.e., cases where ($t_3 \ge T$ and $t_1 < T$ and $t_2 < T$) or ($t_1 \ge T$ and $t_3 < T$ and $t_2 < T$). Considering equations (16), if $t_{1calc}$ varies from 0.001T to 0.9999T, and $t_3$calc varies from T to 4T, then $B_3$ is, in general, greater than or equal to the value of the denominator (see FIGS. 7A–7P). However, the value of $A_3$ will be subtracted from the value of the denominator due to the fact that the sign of $a_{1calc}$ is opposite to the sign of $a_{3calc}$. Thus, no real conclusion can be achieved. In contrast, the values of $B_1$ and $A_1$ will add up, in most cases, to a value greater than the denominator.

Assuming that the magnitude of $a_{3calc}$ is "close" to the maximum value allowed (this will typically be the case), then $a_{1q}$ will be greater than the maximum allowed acceleration. As seen by the behavior of $C_1$, if $v_1$ is not zero, it can reduce or increase the value of the quantized acceleration.

A similar analysis of the case when $t_{3calc}$ varies from 0.001T to 0.9999T and $t_{1calc}$ varies from T to 4T shows that $a_{3q}$ that will be greater than the maximum value allowed, as shown in FIGS. 7A–7P. From the previous analysis, it is clear that the algorithm is well behaved for all values when at least two time intervals are greater than the quantization interval.

In short, if the desired displacement and the initial and/or final velocity violate the three-segment routine constraints, a four-segment trajectory is used instead. The new trajectory will accelerate or decelerate at maximum acceleration until the appropriate velocity is zero. The trajectory then includes a three-segment trajectory to compensate for the remaining displacement.

Another special case occurs when the maximum velocity constraint is violated by a small amount due to quantization, i.e., when $t_{1q}$ is slightly larger than one quantization interval, and $v_1$ is close to $v_{max}$. In order to avoid the throughput impact of generating a four-segment trajectory in this case, the three-segment routine is reevaluated while setting $v_{max}$ to a percentage of its value.

IV. Computer System

The functions performed by trajectory planner 102, which is capable of calculating trajectories as shown in control flow 400, are preferably implemented in software. Alternatively, the same may be implemented using hardware or a combination of hardware and software.

Figure 6:
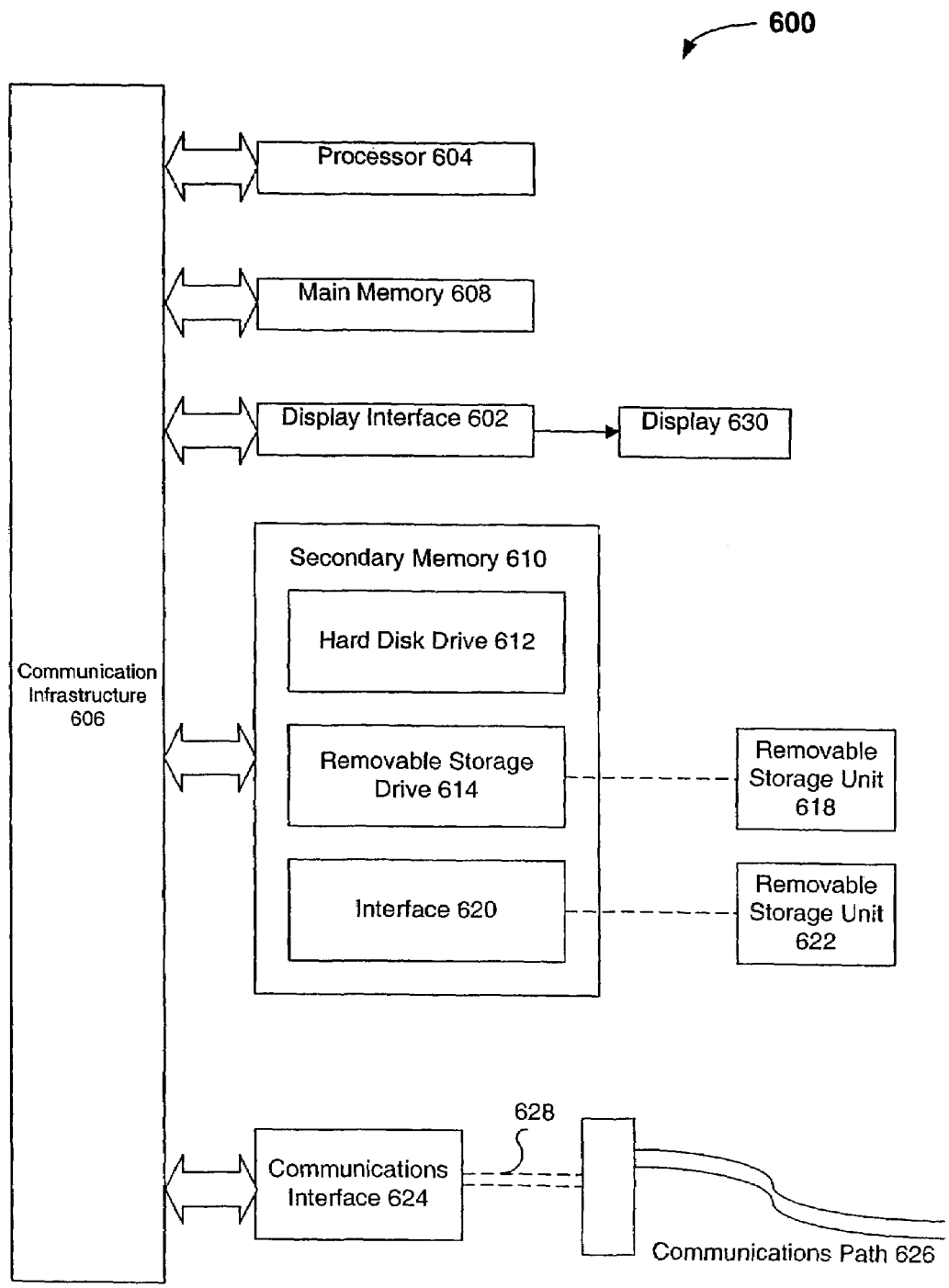
FIG. 6 is a block diagram illustrating the system architecture of an embodiment of a computer system and computer program product, showing connectivity among the various components, that may be used to implement the present invention.

In an embodiment of the present invention, trajectory planner 102 comprises a computer system which may be connected to a network. An example of such a computer system 600 is shown in FIG. 6. The computer system 600 represents any single or multiprocessor computer. Single-threaded and multi-threaded computers can be used. Unified or distributed memory systems can be used.

The computer system 600 includes one or more processors, such as processor 604. One or more processors 604 can execute software implementing the operations described in flow 400. Each processor 604 is connected to a communication bus 602 (e.g., cross-bar or network). Various software embodiments are described in terms of this exemplary computer system. After reading this description, it will become apparent to a person skilled in the relevant art how to implement the invention using other computer systems and/or computer architectures.

Computer system 600 also includes a main memory 606, preferably random access memory (RAM), and can also include a secondary memory 608. The secondary memory 608 can include, for example, a hard disk drive 610 and/or a removable storage drive 612, representing a floppy disk drive, a magnetic tape drive, an optical disk drive, etc. The removable storage drive 612 reads from and/or writes to a removable storage unit 614 in a well known manner. Removable storage unit 614 represents a floppy disk, magnetic tape, optical disk, etc., which is read by and written to by removable storage drive 612. As will be appreciated, the removable storage unit 614 includes a computer usable storage medium having stored therein computer software and/or data.

In alternative embodiments, secondary memory 608 can include other means for allowing computer programs or other instructions to be loaded into computer system 600. Such means can include, for example, a removable storage unit 622 and an interface 620. Examples can include a program cartridge and cartridge interface (such as that found in video game devices), a removable memory chip (such as an EPROM, or PROM) and associated socket, and other removable storage units 622 and interfaces 620 which allow software and data to be transferred from the removable storage unit 622 to computer system 600.

Computer system 600 can also include a communications interface 624. Communications interface 624 allows software and data to be transferred between computer system 600 and external devices via communications path 626. Examples of communications interface 620 can include a modem, a network interface (such as Ethernet card), a communications port, etc. Software and data transferred via communications interface 624 are in the form of signals which can be electronic, electromagnetic, optical or other signals capable of being received by communications interface 624, via communications path 626. Note that communications interface 624 provides a means by which computer system 600 can interface to a network such as the Internet.

The present invention can be implemented using software running (that is, executing) in an environment similar to that described above with respect to FIG. 6. In this document, the term "computer program product" is used to generally refer to removable storage unit 614, a hard disk installed in hard disk drive 610, or a carrier wave carrying software over a communication path 626 (wireless link or cable) to communication interface 624. A computer useable medium can include magnetic media, optical media, or other recordable media, or media that transmits a carrier wave. These computer program products are means for providing software to computer system 600.

Computer programs (also called computer control logic) are stored in main memory 606 and/or secondary memory 608. Computer programs can also be received via communications interface 624. Such computer programs, when executed, enable the computer system 600 to perform the features of the present invention as discussed herein. In particular, the computer programs, when executed, enable the processor 604 to perform the features of the present invention. Accordingly, such computer programs represent controllers of the computer system 600.

In an embodiment where the invention is implemented using software, the software can be stored in a computer program product and loaded into computer system 600 using removable storage drive 612, hard drive 610, or communications interface 624. Alternatively, the computer program product can be downloaded to computer system 600 over communications path 624. The control logic (software), when executed by the one or more processors 604, causes the processor(s) 604 to perform the functions of the invention as described herein.

In another embodiment, the invention is implemented primarily in firmware and/or hardware using, for example, hardware components such as application specific integrated circuits (ASICs). Implementation of a hardware state machine so as to perform the functions described herein will be apparent to persons skilled in the relevant art(s).

V. Conclusion

While various embodiments of the present invention have been described above, it should be understood that they have been presented by way of example, and not limitation. It will be apparent to persons skilled in the relevant art(s) that various changes in form and detail can be made therein without departing from the spirit and scope of the invention. Thus the present invention should not be limited by any of the above-described exemplary embodiments, but should be defined only in accordance with the following claims and their equivalents.

What is claimed is:

1. A method, comprising:
   (a) determining a first trajectory to move a device used in a scanning operation during the scanning operation in a lithography environment, the first trajectory including an acceleration phase, a maximum velocity phase, and a deceleration phase; and
   (b) determining a second trajectory correlating to the first trajectory, wherein a time of execution of the second trajectory is below a threshold quanta value, the threshold quanta value being above a time of execution for the first trajectory.

2. The method of claim 1, wherein step (a) comprises:
   calculating a continuous time, three-segment trajectory including the acceleration, maximum velocity, and deceleration phases.

3. The method of claim 2, wherein step (b) comprises:
   converting said continuous time, three-segment trajectory to a discrete time trajectory.

4. The method of claim 1, further comprising using three quanta as the threshold quanta value.

5. The method of claim 1, further comprising using one or more of a pattern forming device stage, a wafer stage, and a framing blade as the device.

6. The method of claim 1, further comprising using a maximum acceleration during the acceleration phase.

7. The method of claim 1, further comprising using a maximum deceleration during the deceleration phase.

8. A method, comprising:
   (a) determining a first trajectory to move a device used in a scanning operation during the scanning operation in a lithography environment, the first trajectory including a first phase to move the device at a maximum acceleration, a second phase to move the device at a maximum velocity, and a third phase to move the device at a maximum deceleration; and
   (b) determining a second trajectory correlating to the first trajectory, wherein a time of execution of the second trajectory is below a threshold quanta value, the threshold quanta value being above a time of execution for the first trajectory.

9. The method of claim 8, wherein step (a) comprises:
   calculating a continuous time, three-segment trajectory including the acceleration, maximum velocity, and deceleration phases.

10. The method of claim 9, wherein step (b) comprises:
    converting said continuous time, three-segment trajectory to a discrete time trajectory.

11. The method of claim 8, further comprising using three quanta as the threshold quanta value.

12. The method of claim 8, further comprising using one or more of a pattern forming device stage, a wafer stage, and a framing blade as the device.

13. The method of claim 8, wherein said first trajectory is represented by the equations $$v_2 = a_1 t_1 + v_1$$

$$v_3 = a_2 t_2 + v_2$$

$$v_4 = a_3 t_3 + v_3$$

$$s_1 = \frac{1}{2} a_1 t_1^2 + v_1 t_1$$

$$s_2 = \frac{1}{2} a_2 t_2^2 + v_2 t_2$$

$$s_3 = \frac{1}{2} a_3 t_3^2 + v_3 t_3$$

wherein
   v1 is an initial velocity of the device;
   v2 is a second velocity of the device;
   v3 is a third velocity of the device;
   v4 is the final velocity of the device;
   t1 is the duration of the first phase of the first trajectory;
   t2 is the duration of the second phase of the first trajectory;
   t3 is the duration of the third phase of the first trajectory;
   s1 is a second position of the device, associated with the beginning of the second phase of the first trajectory;
   s2 is a third position of the device, associated with the beginning of the third phase of the first trajectory;
   s3 is a fourth position of the device, associated with the end of the third phase of the first trajectory;
   a1 is a first acceleration of the device, associated with the first phase of the first trajectory;
   a2 is a second acceleration of the device, associated with the second phase of the first trajectory;
   a3 is a third acceleration of the device, associated with the third phase of the first trajectory;
   a2=0;
   v2=v3;
   a1=the maximum acceleration=amax; and
   a3=−amax.

14. The method of claim 8, wherein said second trajectory is represented by the equations $$v_{2q} = a_{1q} t_{1q} + v_1$$

$$v_{3q} = a_2 t_{2q} + v_{2q}$$

$$v_4 = a_{3q} t_{3q} + v_{3q}$$

$$s_{1q} = \frac{1}{2} a_{1q} t_{1q}^2 + v_1 t_{1q}$$

$$s_{2q} = \frac{1}{2} a_2 t_{2q}^2 + v_{2q} t_{2q}$$

$$s_{3q} = \frac{1}{2} a_{3q} t_{3q}^2 + v_{3q} t_{3q}$$

wherein
   t1q, t2q, and t3q are quantized versions of t1, t2, and t3 respectively, where
   t1 is the duration of the first phase of the first trajectory;
   t2 is the duration of the second phase of the first trajectory; and
   t3 is the duration of the third phase of the first trajectory;
   s1q, s2q, and s3q are quantized versions of s1, s2, and s3, respectively, where
   s1 is a second position of the device, associated with the beginning of the second phase of the first trajectory;
   s2 is a third position of the device, associated with the beginning of the third phase of the first trajectory;
   s3 is a fourth position of the device, associated with the end of the third phase of the first trajectory;
   v1 is an initial velocity of the device;

v2q and v3q are quantized versions of v2 and v3, respectively, where v2 is a second velocity of the device and v3 is a third velocity of the device;

v4 is the final velocity of the device;

a1q is a quantized version of a1, where a1 is a first acceleration of the device, associated with the first phase of the first trajectory;

a2 is a second acceleration of the device, associated with the second phase of the first trajectory;

a3q is a quantized version of a3, where a3 is a first acceleration of the device, associated with the first phase of the first trajectory; and d=s1+s2+s3.

15. A system, comprising:

a device used in a scanning operation that travels in a lithography environment along a predetermined trajectory;

a control system for controlling said device; and a trajectory planning device, including:

means for determining a first trajectory to move the device during the scanning operation, the first trajectory including an acceleration phase, a maximum velocity phase, and a deceleration phase, and means for determining a second trajectory that correlates to the first trajectory, wherein a time of execution of the second trajectory is below a threshold quanta value, the threshold quanta value being above a time of execution for the first trajectory.

16. The system of claim 15, wherein the means for determining the first trajectory calculates a continuous time, three-segment trajectory including the acceleration, maximum velocity, and deceleration phases.

17. The system of claim 16, wherein the means for determining the second trajectory converts said continuous time, three-segment trajectory to a discrete time trajectory.

18. The system of claim 15, further comprising using three quanta as the threshold quanta value.

19. The system of claim 15, wherein the device is one or more of:

a pattern forming device stage;

a wafer stage; and a framing blade.

20. The system of claim 15, further comprising using a maximum acceleration during the acceleration phase.

\* \* \* \* \*